United States Patent
Henderson et al.

(10) Patent No.: US 8,933,703 B2
(45) Date of Patent: Jan. 13, 2015

(54) SYSTEMS AND METHODS FOR FACILITATING USE OF A UNIVERSAL TEST CONNECTION FOR A PLURALITY OF DIFFERENT DEVICES

(75) Inventors: David Henderson, Santa Rosa, CA (US); Sean P. Cortright, Santa Rosa, CA (US); Calvin Krug, Santa Rosa, CA (US); Ryan Kelley, Santa Rosa, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 1860 days.

(21) Appl. No.: 11/864,235

(22) Filed: Sep. 28, 2007

(65) Prior Publication Data
US 2009/0033338 A1    Feb. 5, 2009

Related U.S. Application Data

(60) Provisional application No. 60/962,677, filed on Jul. 31, 2007.

(51) Int. Cl.
*H01H 31/02*    (2006.01)

(52) U.S. Cl.
USPC ........................................................ 324/555

(58) Field of Classification Search
USPC ........................................................ 324/555
See application file for complete search history.

(56) References Cited

U.S. PATENT DOCUMENTS

| | | | | |
|---|---|---|---|---|
| 2,088,355 A * | 7/1937 | Wehming | ...................... | 324/408 |
| 3,049,913 A | 10/1958 | Hunt | | |
| 3,810,105 A * | 5/1974 | England | .......................... | 710/43 |
| 4,964,018 A * | 10/1990 | Mallory et al. | ................ | 361/725 |
| 5,032,789 A * | 7/1991 | Firooz et al. | ................... | 324/754 |
| 5,208,529 A * | 5/1993 | Tsurishima et al. | .......... | 324/754 |
| 5,216,361 A * | 6/1993 | Akar et al. | ..................... | 324/761 |
| 5,804,732 A | 9/1998 | Wetzel et al. | | |
| 5,872,458 A | 2/1999 | Boardman et al. | | |
| 6,446,508 B1 | 9/2002 | Peterson et al. | | |
| 6,608,399 B2 * | 8/2003 | McConnell et al. | ......... | 307/10.1 |
| 6,863,123 B2 | 3/2005 | Wang et al. | | |
| 6,904,807 B1 | 6/2005 | Butts | | |
| 7,212,929 B2 | 5/2007 | Kaneko et | | |
| 7,332,328 B2 | 2/2008 | Webb et al. | | |
| 7,487,680 B2 | 2/2009 | Hammond et al. | | |
| 7,548,081 B1 | 6/2009 | Cortright et al. | | |
| 7,721,608 B2 | 5/2010 | Henderson et al. | | |
| 2009/0031810 A1 | 2/2009 | Henderson et al. | | |
| 2009/0033338 A1 | 2/2009 | Henderson et al. | | |

FOREIGN PATENT DOCUMENTS

SU    815553 B    3/1981

* cited by examiner

*Primary Examiner* — Thomas F Valone (57) ABSTRACT

A module is used for interfacing between a particular device to be tested (DUT) and a test station having a universal set of connections. The module is adapted for bridging both the physical and electrical differences between connection points available on the DUT and the universal test connections. The module contains information (personality data) unique to the particular DUT and is designed to mount in a tray in which the DUT is positioned. The personality module resides partially within an environmentally controlled area and an area outside of the environmentally controlled area and is adapted to seal the environmentally controlled area so as to maintain testing integrity therein. In one embodiment, the connections between the module and the test station occur outside of the environmentally controlled area.

21 Claims, 6 Drawing Sheets

SYSTEMS AND METHODS FOR FACILITATING USE OF A UNIVERSAL TEST CONNECTION FOR A PLURALITY OF DIFFERENT DEVICES

CROSS-REFERENCE TO RELATED APPLICATIONS

The present application claims priority to U.S. Provisional Application No. 60/962,677 filed Jul. 31, 2007, which application is hereby incorporated by reference herein; and this application is related to concurrently filed, and commonly-assigned: U.S. patent application Ser. No. 11/864,284, entitled "TRAY FOR HANDLING DEVICES TO BE TESTED"; and U.S. patent application Ser. No. 11/864,192, entitled "SYSTEMS AND METHODS FOR CONDUCTING SIMULTANEOUS VIBRATION AND ELECTRICAL TESTING."

TECHNICAL FIELD

This disclosure relates to electronic circuit testing systems and more particularly to systems and methods for connecting electronic circuits and devices to test stations.

BACKGROUND OF THE INVENTION

It is common practice to connect electronic circuits and devices (herein called DUTs) to test stations for the purpose of verifying the integrity of the DUT. The testing routines of each device are different for each DUT since each test routine is dependent upon the nature of the DUT. It goes without saying that as devices become more complex, so does the test routine employed for verification of proper operation. In many situations, the test routines extend to vibration testing as well as temperature (hot as well as cold) testing. Thus, it is necessary to connect each DUT to one or more test stations and to make proper electrical contact between the test station and the DUT. When the DUT is to be electrically tested while being vibrated, it is necessary to make both electrical connection to the DUT as well as a mechanical connection to a vibration mechanism. In some situations it is also necessary to perform the electrical testing (and sometimes both electrical and vibration testing) while the DUT is being subjected to various environmental factors, such as, for example, heat and cold.

Compounding the problem is the fact that different devices have different connection terminals which must be electrically and physically mated with the various inputs/outputs of the test station. Traditionally, these connections are made with cords having one end adapted for physical mating with the DUT and the other end adapted for mating with the test station. These cords then must be manually connected, usually at both ends. Compounding the problem even further, is the fact that when environmental testing or vibration testing is being performed, the cords and/or connectors have a physical presence within the environmental chamber surrounding the DUT. Thus the cords and/or connectors are subjected to varying test conditions as the temperatures and device movement (or other environmental factors) change, thereby allowing for possible variations in test results.

BRIEF SUMMARY OF THE INVENTION

The problems inherent with connecting a DUT to a test station have been solved by the use of a tray designed to allow a wide variety of different DUTs to be physically connected individually to a test station using a universal test station connector. The tray allows for the association therewith of a personality module which serves to provide the proper physical connections and to electrically condition the test station to the electrical characteristics of the DUT. The tray allows for sealed environmental testing of the DUT without impacting any physical connections between the DUT and the test station. The tray also allows for the DUT to be vibrated from externally applied motion without interfering with either the sealed environment around the DUT and without imparting motion to the physical connection between the DUT and the test station.

A module is used for interfacing between a particular device to be tested (DUT) and a test station having a universal set of connections. The module is adapted for bridging both the physical and electrical differences between connection points available on the DUT and the universal test connections. The module contains information (personality data) unique to the particular DUT and is designed to mount in a tray in which the DUT is positioned. The personality module resides partially within an environmentally controlled area and an area outside of the environmentally controlled area and is adapted to seal the environmentally controlled area so as to maintain testing integrity therein. In one embodiment, the connections between the module and the test station occur outside of the environmentally controlled area.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
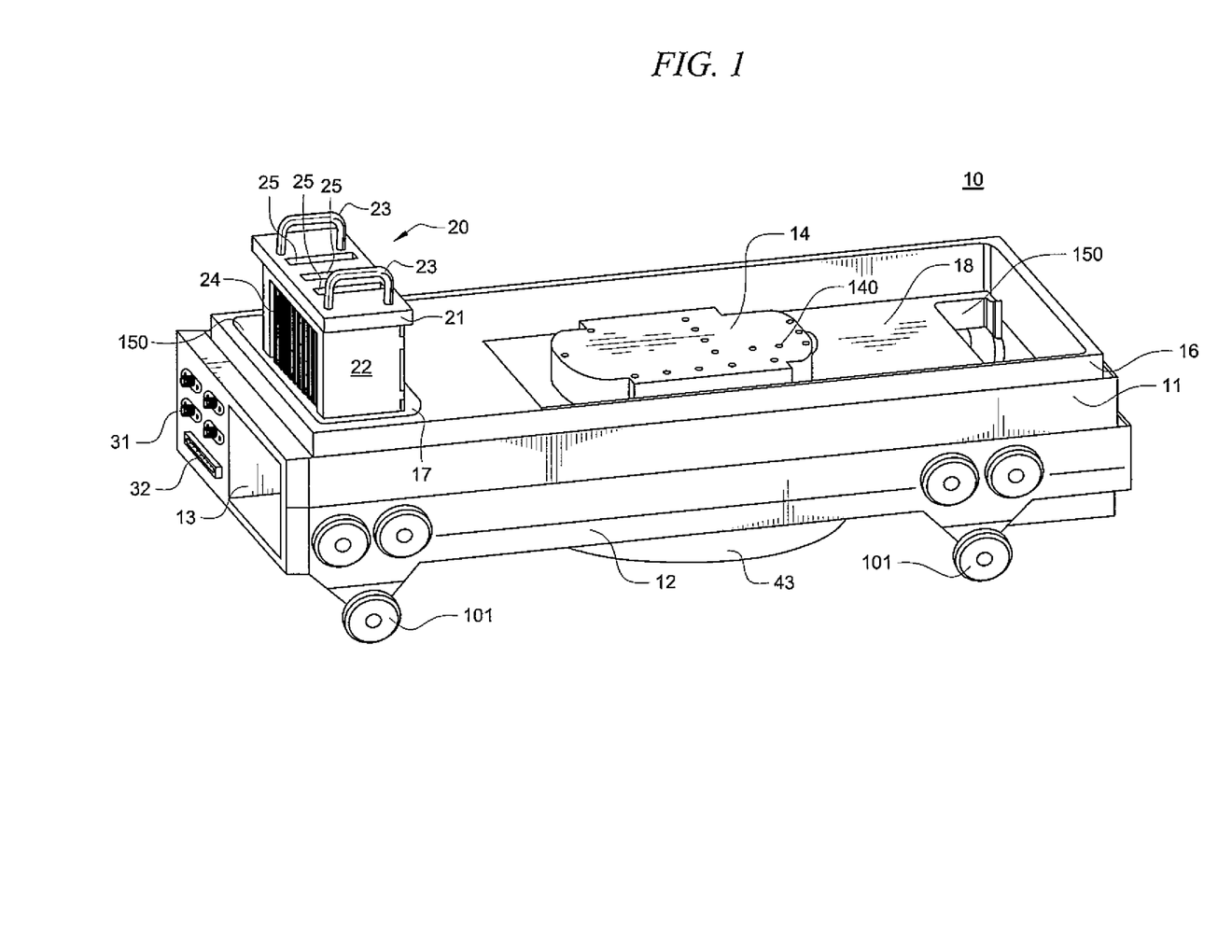
FIG. 1 shows one embodiment of a tray for holding a device under test (DUT) on a pedestal so as to allow for vibration testing of the DUT in accordance with the concepts of the invention.

FIG. 1 shows one embodiment of a tray, such as tray 10, for holding a device under test (DUT) (not shown) within a confined chamber defined by tray sides 11 surrounding pedestal 14 so as to allow for vibration testing of the DUT. The confined chamber can be environmentally controlled as will be discussed. Tray 10 is designed such that a cover (not shown) can be secured over the top of the DUT and inflated with environmentally conditioned air, or other elements, via one or more ducts, such as via ducts 150. The inflatable cover can be affixed to lip 16 of tray 10. The base or bottom of the confined area is defined by surface 18 (FIG. 2) and the top of the confined area by the inside of the cover.

Pedestal 14 while providing support for holding a DUT has bracket support 501 (shown in FIG. 5) resting on tray base 18 when vibration is not occurring. A holding device (not shown) for the DUT is locked to pedestal 14 via, for example, tapped holes 140. The DUT (shown as item 602 in FIG. 6) can be held in any desired position by the holding device. When in the non-vibrating state, pedestal 14 rests on tray base 18. When vibration occurs, as will be discussed, pedestal 14 is raised from tray base 18 and is thus free to move in any desired direction.

Opening 17 allows a personality module, such as module 20, to be inserted therein. As will be more fully discussed, personality module 20 contains connectors 24 and/or any other desired devices, such as calibration circuitry, calibration data, error-correction circuitry/data, signal level setting, cable correction data, DUT identification data, etc. Module 20 allows for connection to a test facility when the module is inserted into opening 17 such that electrical terminals, such as connectors 24 of the module, appear through opening 13. Also contained on tray 10 are electrical terminals, such as RF connectors 31 and connector 32. Wheels 101 facilitate tray 10 sliding into and out of a test stand (not shown in FIG. 1). Wheels are not necessary for the operation of the tray and or other aspects of this disclosure. Connector 43, as will be discussed in more detail, is positioned below tray base 18 at the distal end of pedestal 14 and serves to releasably connect pedestal 14 to a vibration device.

Figure 2:
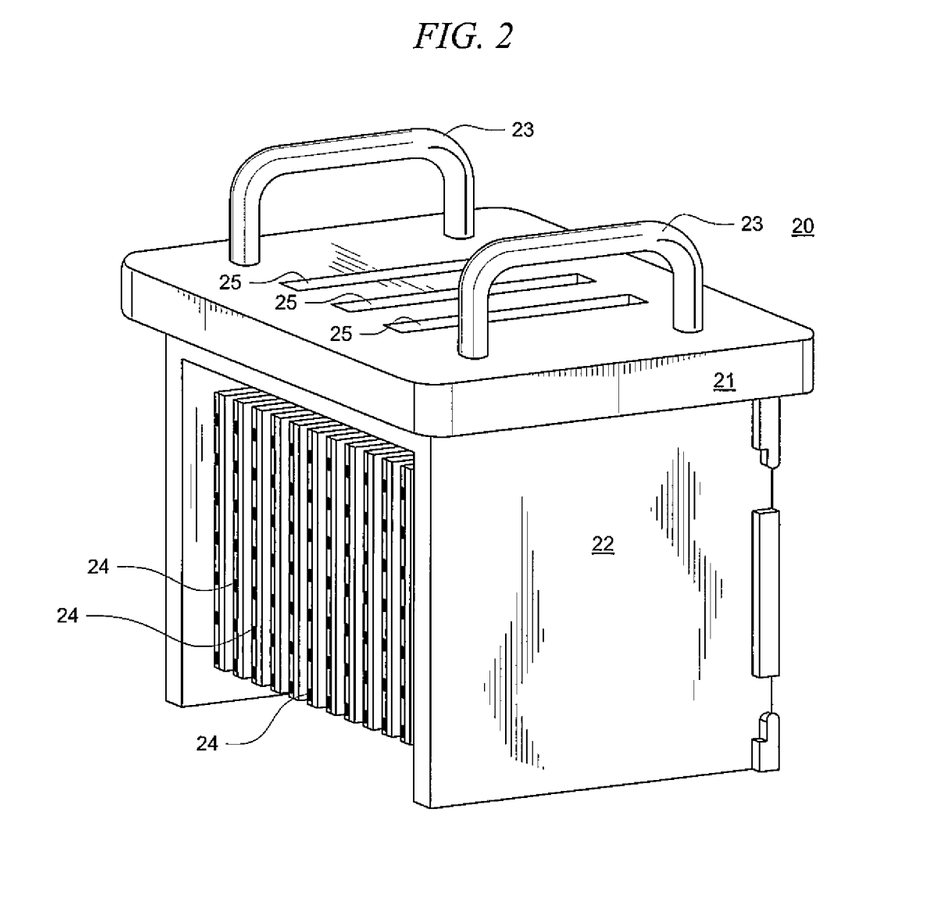
FIG. 2 shows one embodiment of a personality module for controlling test parameters with respect to a DUT in accordance with the concepts of the invention.

FIG. 2 shows one embodiment of a personality module, such as module 20, for controlling test parameters with respect to a DUT. In the embodiment shown, module 20 has handles 23 extending from top structure 21. Structure 21 sits above sides 22 which serve to protect connectors 24. Structure 21, in one embodiment, provides thermal isolation between the inner area of tray 10 and the outer area of the tray so as to help maintain the thermal environment within the test chamber. Connectors 24 are electrically connected to connectors 25 which can, if desired, be fitted with thermal protection as well. One function of handles 23 is to physically protect connectors 25. In one embodiment, connectors 24 are positioned perpendicular to the top surface of module 20.

The purpose of connectors 25, which could be eliminated by hard wiring, if desired, is to cross-connect between the DUT and connectors 24 which connectors are arranged for standard interfacing with universal electrical terminals of test stations. This then allows connectors 24 to be uniform for all personality modules which in-turn eliminates the need for specialized cables to be used for each different DUT even though the electrical terminals could be different for each DUT. In one embodiment, the cross-connect cables are relatively short, i.e., between 6 inches and two feet. The positioning of connectors 24 in a second portion of the module below the top (first) portion of the module and below the bottom surface of tray 10 (on the outside of the environmentally conditioned area) protects the cables from heat and cold stresses. In addition, because the connectors are uniform across all DUTs it is easier to establish a blind-mate connection with a test system. This blind-mate connection can be as a result of a human positioning one or more trays into a test system or the positioning being accomplished by a robot or other automatic (non-human) system. A third portion of the module, also positioned below the bottom surface of the tray, can contain elements for controlling the testing of the DUT.

Figure 6:
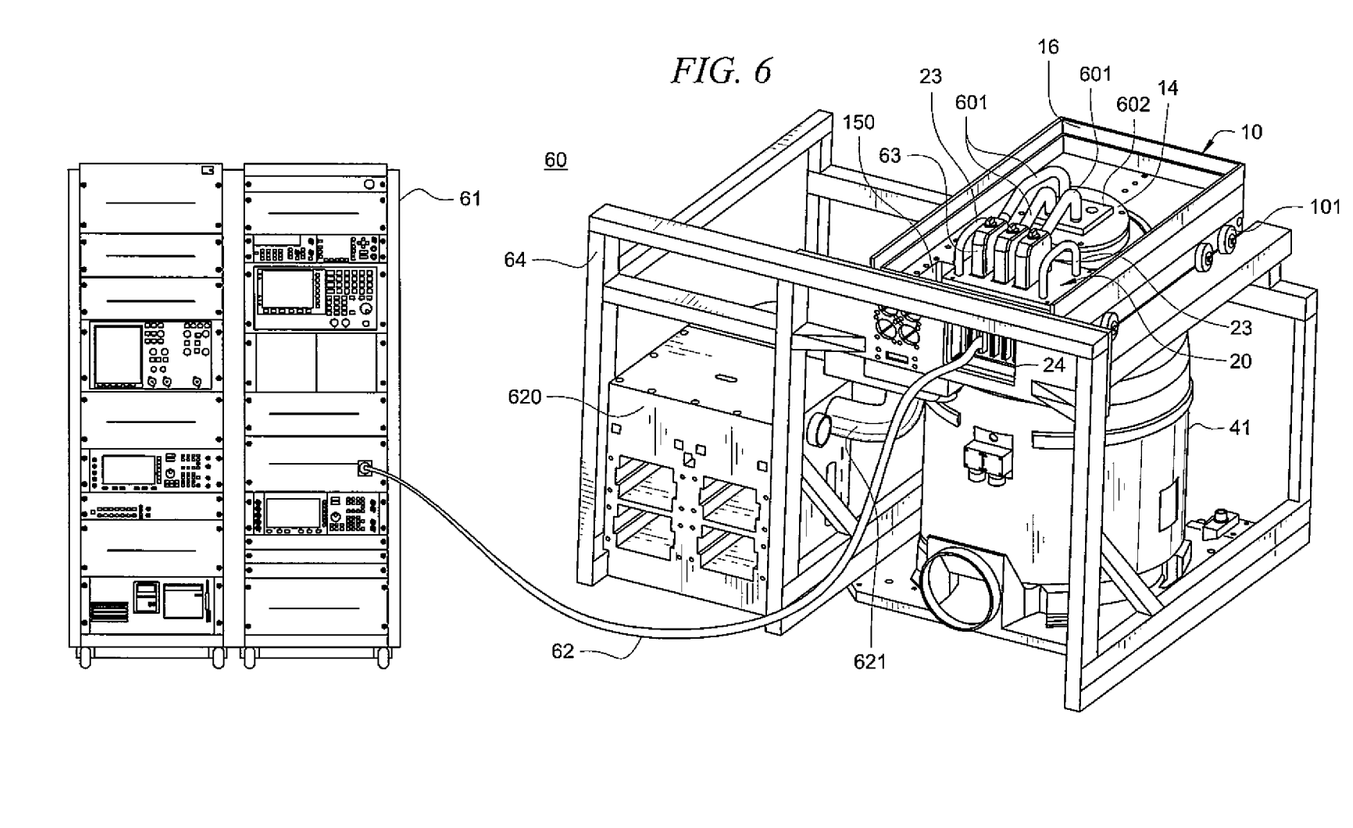
FIG. 6 shows the holding tray of FIG. 1 mounted in a test stand and connected electrically to a test facility.

The personality module, which in one embodiment has an outer dimension of approximately 8 inches by 11 inches by 12 inches high, serves a number of different roles all such that a particular DUT can be conditioned to be tested using a standard interface connection between the DUT and the test facility. Thus, when a particular DUT is to be tested, a module 20 designed specifically for that particular DUT is selected and associated with the DUT. Both the particular DUT and the selected module are positioned within tray 10 in association with the pedestal upon which the DUT is clamped. The DUT is electrically connected to the module using test cables, such as test cables 601, either permanently affixed to the module or connected thereto (as shown in FIG. 6). The selected module is designed having circuitry (not shown) for providing conditioning information test signals from the connected test facility and for optionally instructing the test facility as to what test to be performed. Some of this conditioning information can take the form of control signals that can be, for example, calibration elements, calibration data, error-correction data, signal level setting data, power supply data, cable correction data, device identification.

In a robotic situation, the module that is assigned to a tray also can contain routing instructions for a robot so that the module becomes connected to the proper test facility or facilities and associated with the DUT being held by the pedestal. Thus, different DUTs can be assigned different trays with each tray then receiving a module matching the DUT. The tray then controls its destiny through a robotic test system. When robotics is not used for tray movement purposes, the module continues to serve to condition the test facilities to set-up test requirements for the particular DUT associated therewith.

In some embodiments, the modules can have memory and processors and can be reprogrammed as required. In some embodiments, the modules can be designed using ASICS or PROMs as desired. Wireless technology, as well as near-field transmission, can be employed to change the programmed parameters.

Figure 3:
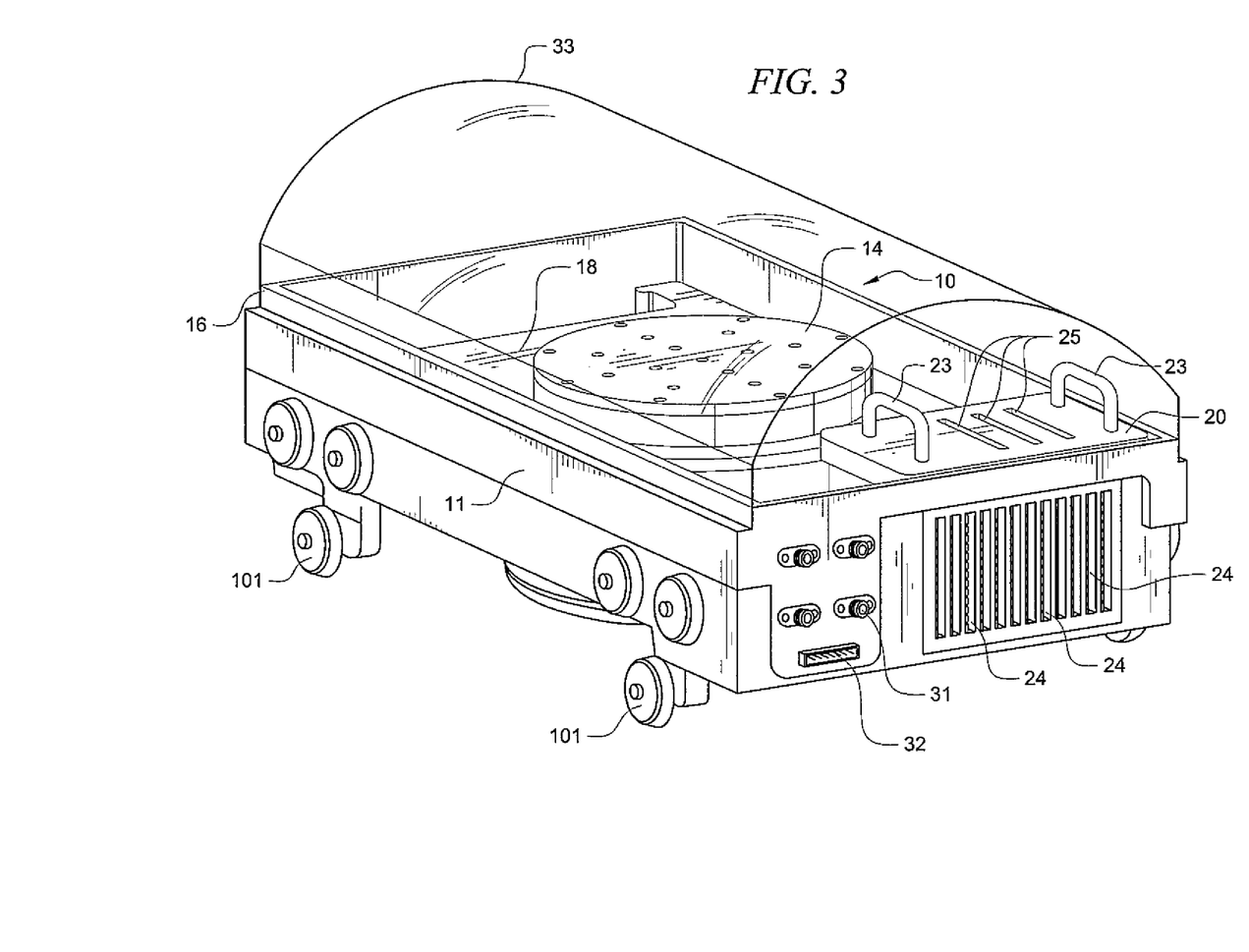
FIG. 3 shows a personality module, in accordance with FIG. 2, positioned within a test tray as shown in FIG. 1.

FIG. 3 shows personality module 20 positioned within test tray 10. In this view pedestal 14 is shown without a DUT being mounted thereon and positioned against tray base 18. When a DUT is mounted on pedestal 14 and it is desired to perform vibration testing, pedestal 14 is raised away from tray base 18 and vibrated in the manner to be discussed. If the vibration testing is to performed within a controlled environment, such as under heated or cooled conditions, "tent" 33, which in one embodiment can be a flexible covering, can be formed around the top area of tray 10 and conditioned air blown in from below the tray. The tent is made from, for example, thermal material such as neoprene.

Other test system connections can be made between the DUT and the test system via RF connectors 31 and/or connector 32.

Figure 4:
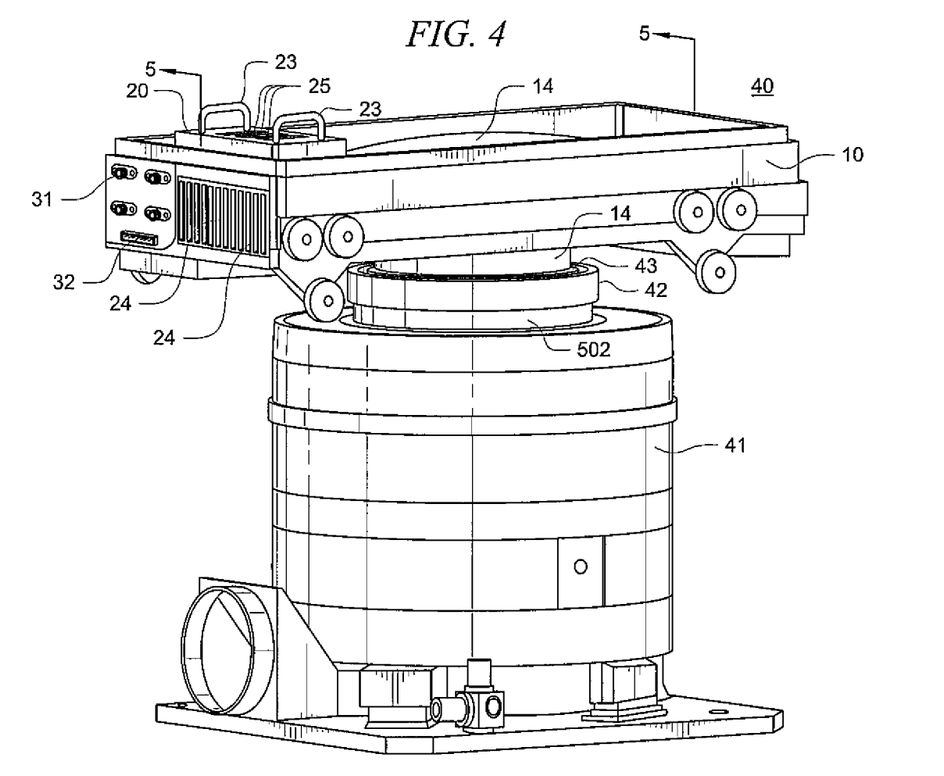
FIG. 4 shows one embodiment of a vibration machine temporarily attached to the pedestal of the holding tray shown in FIG. 1.

FIG. 4 shows system 40 in which vibrator 41 is temporarily attached via connector 43 to connector 42 at the distal end of pedestal 14 which extends downward from tray 10 through the base of the tray. In this manner, the vibrator machinery can be maintained outside of any environment in which the DUT is being tested. Vibrator 41 can be any well-known vibrator or shaker operable for imparting a desired motion (or range of motions) at connector 43 thereby causing the DUT to move in a controlled fashion. In operation, in one embodiment, vibrator 41 causes pedestal 14 to lift away from tray base 18 of tray 10 and then to move in one or more directions under control of connector 42 which extends from a vibrating device; such as vibrator (shaker) 41. In the embodiment shown, vibrator (shaker) 41 is in a fixed location and tray 10 is moved into proximity therewith for testing a DUT. However, the shaker could be portable and the tray fixed or both units could be portable and/or fixed. Note that pedestal 14 has a portion that slides through the tray from surface 18 exiting on the bottom outside surface of the tray.

Figure 5:
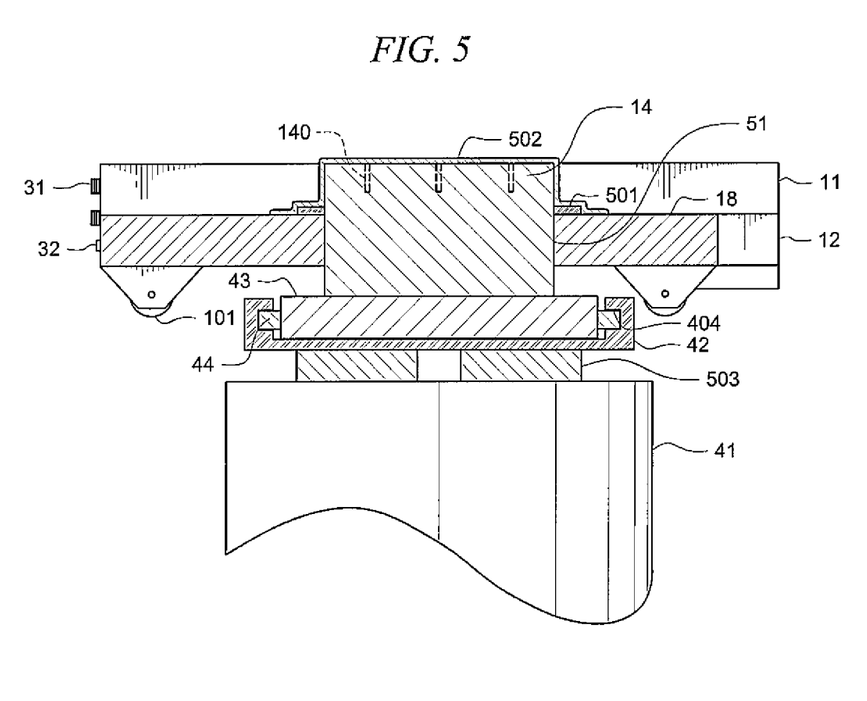
FIG. 5 shows a cut-away schematic view of the attachment of a vibration device to the DUT support pedestal of the holding tray.

FIG. 5 shows a schematic simplified cut-away view of one embodiment of the attachment of vibrator 41 to DUT support pedestal 14 of the holding tray. Note that this view depicts vibrator 41 fully seated with respect to the connection between the vibrator and the pedestal but not yet applying upward pressure on pedestal 14. Thus, pedestal 14 is still shown supported by surface 18 via supports 502. As will be discussed, when tray 10 is further lowered, or when vibrator 41 (or stem 503) is raised, or when supports 501 have been withdrawn, pedestal 14 will cease to be supported by surface 18. Note also that thermal seal barrier 502, which can be a neoprene boot, is fitted around the surface of pedestal 14 so as to create a thermally sealed area to help reduce thermal leaks so as to maintain the environmental integrity of the treated atmosphere within the sealed chamber confines of tray 10. Thus, when the air has been heated, or cooled, the modified air temperature can not escape around the openings between pedestal 14 and surface 18 and also can not travel along pedestal 14 because of the thermal barrier. When pedestal 14 is in the vibrate mode, (not supported by surface 18) material 502 stretches to accommodate both upward motion as well as any lateral movement of the pedestal. Thereby environmentally sealing the portion of pedestal 14 that communicates with the atmosphere outside the thermally sealed confined area. Using this approach the DUT can be vibrated without also vibrating the pedestal that holds the DUT.

A DUT can be directly attached by clamping or otherwise, to the top surface of pedestal 14 and in such a situation the top surface would most likely be sloped. The DUT is connected to the top surface using thermal insulating material, such as pads or gaskets to prevent heat or cold from escaping into the structure of the pedestal. Alternatively, a holding fixture could be employed either on top of boot 502 (again using thermally insulating material for attachment to the pedestal through boot 502) or the fixture could be mounted between boot 502 and top surface of pedestal 14. For the purpose of discussion herein the word pedestal should be understood to include not only the portion that extends downward through opening 51 in the tray bottom surface for communication with the area outside of the confined area for connection to the vibrator but also upward for attachment to a DUT.

Vibrator 41 is temporarily attached, when desired, to support pedestal 14 by connector 42 mating with connector 43. In the embodiment shown, pedestal 14 slides through base surface 18 of tray 10 and when in the 'support' position supports 501 prevent pedestal 14 from falling through surface 18. As will be discussed, supports 501 can be controllably withdrawn, for example, by an actuator (not shown) so as to allow pedestal 14 to float free of surface 18. This would then allow the movable portion of a mated vibrator (as will be discussed) to impart motion to a DUT mounted on the proximal end of pedestal 14 when the vibrator is mated with the pedestal and activated.

Note that while pedestal 14 is shown as a single structure it can be multiple structures having different circumferences at different portions thereof. Connector 43 can be part of the unitary structure of the pedestal or a separate structure. Also note that when such support withdrawal is not desired, supports 501 can simply be a widened portion of the pedestal.

To facilitate a firmly mated connection between connectors 43 and 42 and to also facilitate proper alignment, connector 43, in the embodiment shown, fits inside the circumference of connector 42. Annular gasket 44 is positioned within groove 404 (similar to an o-ring) on the inside wall of connector 42. By fitting the gasket properly, such as by pumping the gasket tight after connectors 42 and 43 are seated together air can be pumped out of the space between the bottom surface of connector 43 and the mating surface of connector 42 to create a temporary vacuum seal between connectors 42 and 43. In order to facilitate the vacuum seal, gasket 44 can have holes therein (not shown) which will allow air to be drawn through the gasket by an air pump or other suction device thereby facilitating a tight mating relationship between stem 503 of the vibrator and connector 43 of pedestal 14. In other embodiments, the fact that gasket 44 is made to swell may be enough to create an acceptable friction fit between the connector portions. If desired, pads (not shown) can be positioned between connectors 42 and 43 to facilitate the connection.

In operation, when it is desired to perform vibration testing on a DUT which has been attached to the proximal (top) end of pedestal 14, either tray 10 is lowered so as to position connector 43, located at the distal end of pedestal 14, against connector 42, as discussed above, from vibrator 41, or vibrator 41 is raised (hydraulically or pneumatically) so that pedestal 14 is forced upward away from tray base 18 of tray 10, or bracket stops 501 are withdrawn as above noted. Connectors 42 and 43, as discussed can be releasable mated together so that whatever motion vibrator stem 503 has is imparted to pedestal 14 and ultimately to the DUT when the vibrator is activated. Note that as discussed, the flexible nature of thermal material 502 allows the motion of stem 503 to be imparted faithfully to the DUT.

FIG. 6 shows test system 60 in which holding tray 10 is mounted in a test stand, such as testing station 64. In this embodiment, test system 60 is connected by connector cable 62 to personality module 20 of tray 10, shown without the environmental cover. Note that personality module 20 is an interface unit between the test device and the DUT. Note also that connector cables 601 connect module 20 to DUT 602 via connectors 63 which connectors, as discussed above, can be thermally insulated as can be connector cables 601. Also shown is temperature control device 620 which can be used for imparting environmental conditions, for example via ducts 621 and 150 (FIG. 1) to the DUT inside the environmental chamber from a position outside of the environmental chamber.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A module for use in a test system said module comprising:
   a first portion for allowing electrical connection with a particular device to be tested (DUT), said electrical connection using electrical terminals specific to said particular DUT;
   a second portion for allowing for electrical connection to a test station having universal electrical terminals for use with a plurality of DUTs each having a different corresponding connector configuration; and
   a third portion for maintaining a personality of said particular DUT, said personality comprising conditioning information for controlling parameters used by said test station for testing said particular DUT.

2. The module of claim 1 having a physical outer dimension adapted to be inserted partially through a DUT tray, said outer physical dimension being the same as an outer dimension of a plurality of other modules which maintain personalities of other particular devices.

3. A system including the module of claim 1, the system further comprising:
   a tray for holding the particular DUT; and
   means for positioning said tray with respect to the test station,
   wherein the module is temporarily associated with said tray, said module bridging any physical differences between said universal electrical terminals of the test station and the electrical terminals specific to said particular DUT.

4. The module of claim 1, further comprising a connectorized cable for directly connecting the test station to the second portion of the module.

5. The module of claim 1, further comprising a connectorized cable for directly connecting the DUT to the first portion of the module.

6. The module of claim 1, wherein said DUT is maintained in a controlled thermal environment and wherein said first portion is adapted for use within said controlled thermal environment, and wherein said first portion is separated from said second and third portions by a thermal barrier.

7. The module of claim 6 wherein said thermal barrier comprises at least one thermal seal.

8. The module of claim 7 further comprising:
   handles protruding from a top surface of said first portion, said handles spaced apart and positioned nearer to an edge of said module than to each other.

9. The module of claim 8 further comprising a cable providing the electrical connection to the first portion, said cable having a least one thermally insulated portion.

10. The module of claim 9 wherein said cable is plugged into terminals positioned on said module between said handles.

11. The module of claim 10 wherein said second portion comprises:
    blind-mate electrical connectors for mating with the universal electrical terminals of the test station.

12. The module of claim 11 wherein said blind-mate electrical connectors are positioned perpendicular to said top surface of said first portion and are thermally insulated from said top surface.

13. The module of claim 10 wherein said cable is between 6 inches and 24 inches in length.

14. The module of claim 2 wherein said outer dimension is approximately 8 inches wide by 11 inches long by 12 inches high.

15. The system of claim 3 wherein said conditioning information includes information for conditioning said test station to perform testing according to test requirements specific to said held DUT.

16. The system of claim 3 further comprising:
    means for maintaining a controlled environment with respect to said held DUT; and
    at least one seal for separating said module from said maintained environment.

17. The system of claim 3, further comprising a connectorized cable for directly connecting the DUT to the first portion of the module.

18. The system of claim 17, further comprising a second connectorized cable for directly connecting the test station to the second portion of the module.

19. The system of claim 3, further comprising a connectorized cable for directly connecting, the test station to the second portion of the module.

20. The system of claim 16 wherein said maintaining means comprises:
    at least one duct for allowing environmentally conditioned air to enter said environment.

21. The system of claim 16 wherein said DUT is maintained in the controlled environment, and wherein said first portion of said module is adapted for use within said controlled environment, and wherein said first portion of said module is separated from said second and third portions of said module by a thermal barrier.

* * * * *